United States Patent
Yin et al.

(10) Patent No.: US 12,532,568 B2
(45) Date of Patent: Jan. 20, 2026

(54) SHINGLED CELL, CELL UNIT, AND SHINGLED PHOTOVOLTAIC ASSEMBLY

(71) Applicant: TONGWEI SOLAR (HEFEI) CO., LTD., Hefei (CN)

(72) Inventors: Bingwei Yin, Hefei (CN); Huaming Zhou, Hefei (CN); Yan Li, Hefei (CN); Gang Shi, Hefei (CN)

(73) Assignee: TONGWEI SOLAR (HEFEI) CO., LTD., Hefei (CN)

( * ) Notice: Subject to any disclaimer, the term of this patent is extended or adjusted under 35 U.S.C. 154(b) by 0 days.

(21) Appl. No.: 18/255,039

(22) PCT Filed: Jan. 29, 2022

(86) PCT No.: PCT/CN2022/075103
§ 371 (c)(1),
(2) Date: May 30, 2023

(87) PCT Pub. No.: WO2022/237243
PCT Pub. Date: Nov. 17, 2022

(65) Prior Publication Data
US 2024/0097059 A1    Mar. 21, 2024

(30) Foreign Application Priority Data
May 12, 2021  (CN) .......................... 202110520958.3

(51) Int. Cl.
H10F 77/20 (2025.01)
H10F 19/90 (2025.01)

(52) U.S. Cl.
CPC ........... H10F 77/215 (2025.01); H10F 19/90 (2025.01)

(58) Field of Classification Search
CPC ............. H01L 31/022433; H01L 31/05; H01L 31/0504; H01L 31/022425; H01L 31/042; Y02E 10/50
See application file for complete search history.

(56) References Cited

U.S. PATENT DOCUMENTS

2015/0349703 A1\* 12/2015 Morad .................. H01L 31/049
                                                                136/251
2017/0301801 A1    10/2017 Nguyen
(Continued)

FOREIGN PATENT DOCUMENTS

CN        105917472 A    8/2016
CN        205863177 U    1/2017
(Continued)

OTHER PUBLICATIONS

Australian Office Action for corresponding Application No. 2022271967, dated Jun. 27, 2024, 5 pages.
(Continued)

*Primary Examiner* — Michael Y Sun
(74) *Attorney, Agent, or Firm* — Dority & Manning, PA

(57) ABSTRACT

Disclosed are a shingled cell, a cell unit, and a shingled photovoltaic assembly. The cell unit includes a cell. The front side of the cell includes a plurality of parallel front-side fine grid lines. The back side of the cell includes a plurality of parallel back-side fine grid lines and a front-side connection line. The front-side connection line is a continuous or non-continuous line segment. The front-side connection line is arranged on at least one side of the cell. The front-side connection line is connected to the ends of all the front-side fine grid lines on the same side. The front-side connection line is such configured that when two cell units are overlapped along the extension direction of the front-side fine grid lines, the front-side connection line of the lower cell (Continued)

unit contacts each of the back-side fine grid lines of the upper cell unit.

12 Claims, 7 Drawing Sheets

(56) References Cited

U.S. PATENT DOCUMENTS

2021/0126153 A1    4/2021  Zhou et al.
2022/0173261 A1*  6/2022  Bettinelli ............. H10F 71/137

FOREIGN PATENT DOCUMENTS

| | | |
|---|---|---|
| CN | 109326665 A | 2/2019 |
| CN | 110556442 A | 12/2019 |
| CN | 110783415 A | 2/2020 |
| CN | 111223962 A | 6/2020 |
| CN | 112234113 A | 1/2021 |
| CN | 113097316 A | 7/2021 |
| WO | WO 2016090332 A1 | 6/2016 |
| WO | WO2021020657 A1 | 2/2021 |

OTHER PUBLICATIONS

Australian Notice of Allowance for corresponding Application No. 2022271967, dated Oct. 31, 2024, 4 pages.

\* cited by examiner

SHINGLED CELL, CELL UNIT, AND SHINGLED PHOTOVOLTAIC ASSEMBLY

CROSS-REFERENCE TO RELATED DISCLOSURES

This application is a national stage application of PCT international application No. PCT/CN2022/075103 filed on Jan. 29, 2022, which claims priority to Chinese patent application No. 202110520958.3 filed with the Chinese Patent Office on May 12, 2021, entitled "SHINGLED CELL, CELL SRIP, AND SHINGLED PHOTOVOLTAIC ASSEMBLY", the entire contents of which are incorporated by reference.

TECHNICAL FIELD

The present disclosure relates to the solar cell manufacturing technology, and in particular, to a shingled cell, a cell unit, and a shingled photovoltaic assembly.

BACKGROUND

As the consumption rate of conventional fossil energies such as coal, oil, and natural gas accelerates globally, the ecological environment continues to deteriorate, and the sustainable development of human society has been seriously threatened. Countries have formulated energy development strategies to address the limitations of conventional fossil energy resources and the environmental issues brought by the development and utilization of the fossil energy resources. Solar energy has become one of the most important renewable energy sources and is expected to become a major pillar of global electricity supply in the future due to its reliability, safety, universality, longevity, environmental friendliness, and abundant.

SUMMARY

In a first aspect, some embodiments of the present application provide a cell unit including a cell. The front side of the cell includes a plurality of parallel front-side fine grid lines. The back side of the cell includes a plurality of parallel back-side fine grid lines. The front side of the cell also includes a front-side connection line. The front-side connection line is a continuous or non-continuous line. The front-side connection line is arranged on at least one side of the cell. The front-side connection line is connected to the ends of all the front-side fine grid lines on the same side. The front-side connection line is such configured that when two cell units are overlapped along the extension direction of the front-side fine grid lines, the front-side connection line of the lower cell unit contacts each of the back-side fine grid lines of the upper cell unit.

In a possible implementation, for each cell, an edge area of the front side where the front-side connection line is located and an opposite edge area of the back side are overlap areas. The front-side connection line is located within the overlap area on the front side of the cell and directly connected to the front-side fine grid lines. A distance between the front-side connection line and endpoints of the front-side fine grid lines on a same side is equal to or greater than zero and less than a width of the overlap area.

In a possible implementation, the front-side fine grid lines and the back-side fine grid lines of each cell unit are parallel to each other, and/or the front-side connection line is perpendicular to the front-side fine grid lines. Alternatively, the back side of the cell comprise a back electrode and a back surface field instead of the back-side fine grid lines, the front-side fine grid lines and the back electrode of each cell unit are perpendicular to each other.

In a possible implementation, the front-side connection line is a continuous long line, and the long line is connected to the ends of all the front-side fine grid lines on the same side, respectively.

In a possible implementation, the front-side connection line is composed of a plurality of short lines arranged at intervals, and each short line is connected to the end of at least one front-side fine grid line on the same side.

In a possible implementation, the back side of the cell further includes a back-side connection line being connected to ends of all the back-side fine grid lines on a same side, respectively. The back-side connection lines and the front-side connection lines are respectively located on edges of opposite sides of the cell. The back-side connection line is such configured that when two the cell units are overlapped along the extension direction of the front-side fine grid lines, the back-side connection line of the upper cell unit contacts each front-side fine grid line of the lower cell unit.

In a possible implementation, the front-side connection line is arranged on one edge of the front side of the cell and on the same side of the front-side fine grid lines, an auxiliary connection line is arranged on the other edge of the front side. A width of the auxiliary connection line is not greater than that of the front-side fine grid lines, and the auxiliary connection line is connected to all the front-side fine grid lines respectively.

In a possible implementation, the front-side fine grid lines and the back-side fine grid lines are printed using silver paste.

In a possible implementation, widths of the front-side fine grid lines and the back-side fine grid lines are the same and greater than that of the front-side connection line.

In a possible implementation, a layout density of the front-side fine grid lines is smaller than that of the back-side fine grid lines.

In a possible implementation, all the short lines being arranged in a straight line. Each short line is connected to endpoints of two adjacent front-side fine grid lines on the same side. Alternatively, each short line is connected to an end of one corresponding front-side fine grid line. Alternatively, each short line is connected to ends of two adjacent front-side fine grid lines on the same side, and a distance between the front-side connection line and the endpoints of the front-side fine grid lines on the same side is greater than zero.

In a possible implementation, the short lines are grouped into a first group and a second group. Each group of short lines being arranged in a straight line. The two groups of short lines being staggered. Each short line of the first group is connected to an endpoint of one corresponding front-side fine grid line. The short lines of the second group are respectively connected to corresponding ends of remaining front-side fine grid lines on a same side, and a distance between the short lines of the second group and the endpoints of the front-side fine grid lines on the same side is greater than zero, such that some portions of the front-side connection line indent compared to the front-side fine grid lines.

Other embodiments of the present disclosure provide a shingled cell, which can be cut into a plurality of cell units provided in the first aspect.

Some other embodiments of the present disclosure provide a shingled photovoltaic assembly, which include a plurality of cell strings. Each cell string is formed by connecting multiple cell units provided in the first aspect in sequence along the extension direction of the front-side fine grid lines.

In a possible implementation, when the cell units are overlapped in a form of shingles, overlap areas of adjacent cell units are stacked and bonded using conductive or non-conductive adhesive.

BRIEF DESCRIPTION OF THE DRAWINGS

In order to illustrate the technical solutions of the embodiments of the present disclosure more clear, the accompanying drawings used in the description of the embodiments of the present disclosure will be briefly introduced below. It should be understood that the accompanying drawings only illustrate some embodiments of the present disclosure and therefore should not be considered as limiting the scope. For those of ordinary skill in the art, other relevant drawings can be obtained from these drawings without creative effort.

SYMBOLS IN THE DRAWINGS

Figure 1:
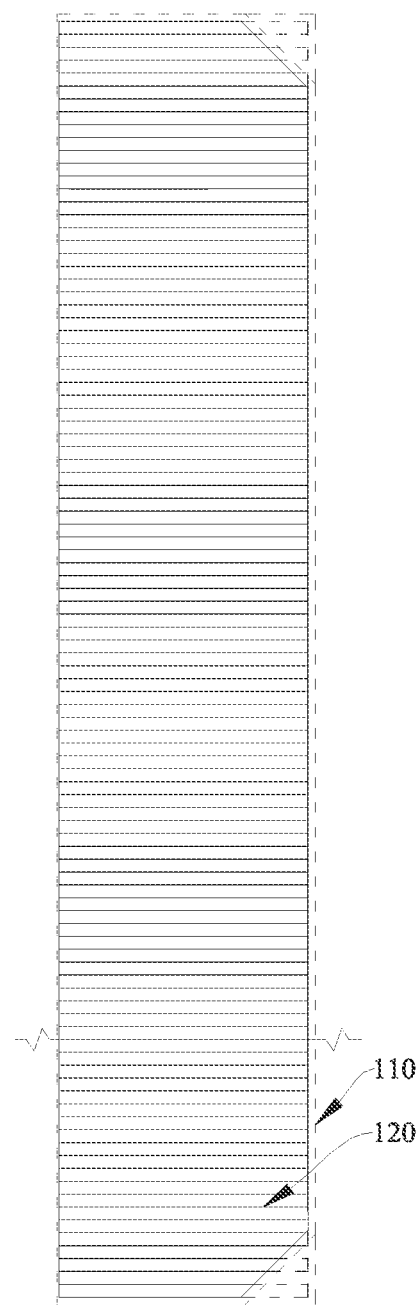
FIG. 1 is a schematic diagram of a front structure of a cell unit according to a first embodiment of the present disclosure.

100—cell unit; 110—cell body; 120—front-side fine grid line; 130—front-side connection line; 140—auxiliary connection line; 150—back-side fine grid line; 160—back-side connection line; 200—cell unit; 210—front-side connection line; 300—cell unit; 310—front-side connection line; 400—cell unit; 410—front-side connection line; 500—cell unit; 510—front-side connection line; 600—cell unit; 610—front-side connection line; 700—cell unit; 710—front-side connection line.

DETAILED DESCRIPTION OF THE EMBODIMENTS

The technical solutions in the embodiments of the present disclosure will be described below in conjunction with the drawings in the embodiments of the present disclosure.

In order to make the purpose, technical solutions, and advantages of the present embodiments of the present disclosure more clear, a clear and complete description of the technical solutions of the embodiments of the present disclosure will be provided in conjunction with the drawings in the embodiments of the present disclosure. Obviously, the described embodiments are only a part of the embodiments of the present disclosure, but not all of them. The components described and demonstrated in the accompanying drawings of the embodiments of the present disclosure can be arranged and designed in various configurations.

Therefore, the detailed descriptions of the embodiments of the present disclosure provided in the accompanying drawings are not intended to limit the scope of the present disclosure to be protected, but only represents the selected embodiments of the present disclosure. All other embodiments obtained by a person of ordinary skill in the art without creative effort, based on the embodiments in the present disclosure, fall within the protection scope of the present disclosure.

It should be noted that similar symbols and letters in the following drawings represent similar items. Therefore, once an item is defined in one drawing, it does not need to be further defined or explained in subsequent drawings.

In the description of the present disclosure, it should be noted that the orientational or positional relationships indicated by the terms "above", "below", "left", "right", "inside", "outside", etc. is based on the orientational or positional relationship shown in the accompanying drawings or the customary placement of the claimed product. These terms are only for the convenience of describing and simplifying the description of the present disclosure, and do not indicate or imply that the device or component referred to must have a specific orientation, constructed and operated in a specific orientation. Therefore, these terms cannot be understood as limiting the present disclosure. In addition, terms such as "first", "second", "third", etc. are only configured to distinguish descriptions and cannot be understood as indicating or implying relative importance.

It should also be noted in the description of the present disclosure that unless otherwise defined and limited, the terms "set" and "connect" should be interpreted broadly. For example, it may be a fixed connection, a detachable connection, or an integral connection. It may also be a mechanical connection or an electrical connection. It may be a direct connection or an indirect connection through an intermediate medium. It may also be an interconnection within two components. For those skilled in the art, the specific meanings of these terms in the present disclosure can be understood based on specific situations.

In the context of vigorously promoting and using the green energy of solar energy, shingled assemblies can significantly improve the assembly power. The shingled assemblies are formed by dividing an entire solar cell into several cell units in accordance with a special graphic design. The cell units are then overlapped in certain areas that have good consistency and bonded together, or directly jointed physically through carrier transport channels on the surface of the cell units. Conventional shingled cells have busbars, for example, there is a front-side busbar on the front edge of the cell unit and a back-side busbar on the corresponding back edge. When two pieces of cell units are overlapped in a shingled form, the front-side busbar of one cell unit is overlapped and bonded with the back busbar of the other cell unit through conductive glue or non-conductive glue, and the inter-cell current conduction needs to be ensured. Such designs with busbars result in high silver paste consumption for producing shingled assemblies, without significant cost advantage.

First Embodiment

Referring to FIG. 1, FIG. 2, FIG. 9, and FIG. 10, this embodiment provides a cell unit 100, which includes a cell 110 (the outermost dashed box in the figures). The front side of the cell 110 includes a plurality of parallel front-side fine grid lines 120, and the back side of the cell 110 includes a plurality of parallel back-side fine grid lines 150 (in other embodiments, a back electrode (not shown in the figures) and a back surface field (not shown in the figures) are provided on the back side). The front side of the cell 110 also includes a front-side connection line 130. The width of the front-side connection line 130 is not greater than the widths of the front-side fine grid lines 120. In other embodiments, the width of the front-side connection line 130 may be greater than the widths of the front-side fine grid lines 120. The front connection line 130 is arranged on at least one side of the cell 110 and connected to the ends/endpoints of all the front-side fine grid lines 120 on the same side, respectively. The front connection line 130 is such configured that when two cell units 100 are overlapped along the extension direction of the front-side fine grid lines 120, the front-side connection line 130 of the lower cell unit 100 contacts each back-side fine grid line 150 of the upper cell unit 100. "A plurality of" in the embodiments of the present disclosure refers to a quantity greater than or equal to 3.

In this embodiment, the grid lines on the front side of the cell unit from a front electrode, and the grid lines on the back side form a back electrode. Busbars of the conventional cell unit are removed. Compared with the fine grid lines, the busbar has a large width, large space occupation, and high consumption of printing materials (usually silver paste). In addition, the front-side connection line for current confluence is designed on the front side of the cell. Compared with the busbar, the front-side connection line is smaller in width, which can save the conductive paste. The width of the connection line can be greater than that of the auxiliary grid line. In order to further save the conductive paste, the width of the front-side connection line is set to be not greater than that of the front-side fine grid lines, i.e., the front-side connection line has a small width, small space occupation, and low consumption of printing materials compared with the busbar of the conventional cell unit. When the cell units of the embodiments of the present disclosure are overlapped along the direction of the front-side fine grid lines to form a shingled cell, the front-side fine grid lines of the lower cell unit are connected to the back-side fine grid lines of the upper cell unit through the front-side connection line, such that achieve the current conduction between the two cell units. Therefore, the cell unit designed without busbars can greatly reduce electrode production cost and production cost.

In this embodiment, the cell 110 is rectangular with long sides and short sides. Typically, the cell 110 is a silicon wafer which is generally cut from a silicon rod, but is not limited to this. The corner(s) of the cell 110 can be chamfered. In this embodiment, two corners of the cell 110 are chamfered, as presented by the two triangular dashed boxes on the right edge of FIG. 1.

In this embodiment, for each cell unit 100, the front-side fine grid lines 120 are parallel to the short side of the cell 110, i.e., each front-side fine grid line 120 is arranged along the short side. The front-side fine grid lines 120 are arranged at intervals along the long side of the cell 110. The back-side fine grid lines 150 are also parallel to the short side of the cell 110, i.e., each back-side fine grid line 150 is also arranged along the short side. The back-side fine grid lines 150 are arranged at intervals along the long side of the cell 110. The front-side fine grid lines 120 are parallel to the back-side fine grid lines 150. In other embodiments of the present disclosure, the front-side fine grid lines 120 and the back-side fine grid lines 150 may also be arranged in other forms on the cell 110, as long as the cell units 100 arranged in the shingle manner are able to generate current and achieve inter-cell conduction between adjacent cell units 100. For example, all front-side fine grid lines 120 are parallel to the long side of the cell 110, and all back-side fine grid lines 150 are parallel to the long side of the cell 110. Alternatively, all front-side fine grid lines 120 and the back-side fine grid lines 150 are slightly inclined relative to the long side or the short side. In other embodiments, the front grating lines of 120 and the back grating lines of 150 are not limited to being parallel to each other, for example, the front-side fine grid lines 120 may parallel to the short side of the cell 110, while the back-side fine grid lines 150 are slightly inclined relative to the short side. In the case that the back side of the cell 110 includes a back electrode and a back surface field, the front-side fine grid lines 120 of the cell unit 100 are perpendicular to the back electrode.

In this embodiment, when the two cell units are overlapped along the extension direction of the front-side fine grid lines, the front-side connection line of the lower cell unit can be connected with the all the back-side fine grid lines of the upper cell unit by a short total length Typically, the front-side fine grid lines 120, the back-side fine grid lines 150, and the front-side connection line 130 can be printed using silver paste. In this embodiment, the front-side connection line and the front-side fine grid lines can be simultaneously printed in accordance with corresponding layout design. The layout density of the front-side fine grid lines 120 is smaller than that of the back-side fine grid lines 150, i.e., the spacing between the front-side grid lines is greater than that of the back-side fine grid lines, ensuring the collection of front-side current, and avoiding the reduction of cell efficiency caused by the high layout density of the front-side fine grid lines 120 and the high coverage of the front-side grid line on the whole surface. In some embodiments, short connections are provided between the front-side fine grid lines 120 so that in case some of the front-side fine grid lines have been poorly printed, other front-side fine grid lines can collect and output current. For example, short connection lines are provided between adjacent front-side fine grid lines 120. These short connection lines are arranged at intervals to keep a low production cost and avoid excessive coverage. In an embodiment, the widths of the front-side fine grid lines 120 and the back-side fine grid lines 150 are the same, and greater than that of the front-side connection line 130.

In the embodiments of the present disclosure, the front-side connection line 130 is a continuous long line that connects to the ends of all front-side fine grid lines 120 on the same side. Therefore, by only ensuring that the front-side connection line and the back-side fine grid lines are located within the overlap area, the continuous long line can easily achieve effective contact with all the back-side fine grid lines to ensure the lap effect. Alternatively, the front-side connection line 130 is composed of multiple spaced short lines, and each short line connects to an end of at least one front-side fine grid line 120 on the same side. The total length of the short lines arranged at intervals is relatively short, which can further reduce the electrode production cost. In the embodiments of the present disclosure, the long line may be straight, curved, or zigzagged, such as an S-shaped line, or a W-shaped line. Alternatively, the multiple short lines are arranged in straight, curved, or zigzagged manner. In an embodiment, the front-side connection line 130 is a continuous long line with a straight shape, and is perpendicular to the front-side fine grid lines 120. In other embodiments, the front-side connection line 130 is inclined relative to the front-side fine grid lines 120, and it needs to ensure that the front-side connection line 130 passes through all the front-side fine grid lines 120 and such that the front-side connection line 130 directly connects with all front-side fine grid lines 120.

Figure 2:
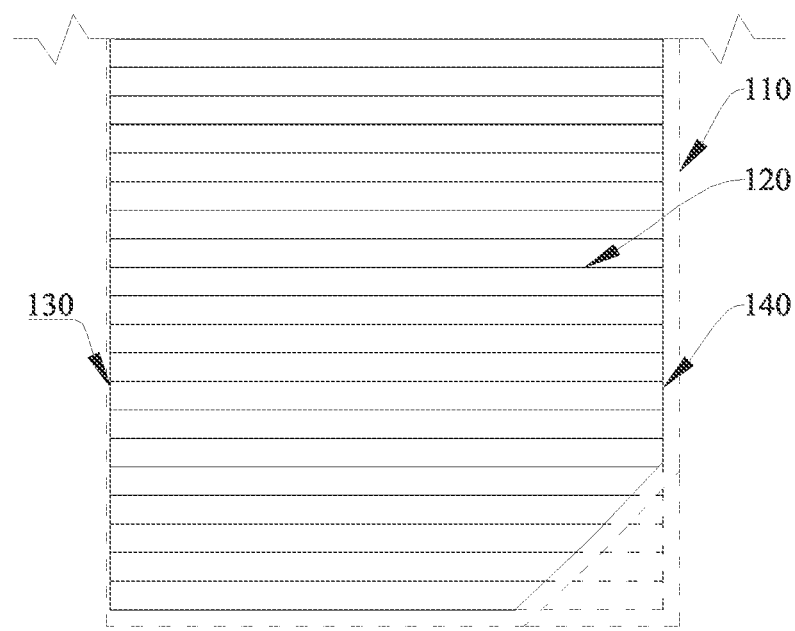
FIG. 2 is a schematic diagram enlarging a structure of the lower half of the cell unit shown in FIG. 1.

Referring to FIG. 1 and FIG. 2, in this embodiment, the front-side connection line 130 is arranged at the edge of the long side of the cell 110, specifically at the edge of the left long side of the cell 110. When two cell units 100 are overlapped, the edges of the long sides of the two cell bodies 110 are overlapped, i.e., the edge of the left long side of the lower cell unit 100 overlaps with the edge of the right long side of the upper cell unit 100.

In the embodiments of the present disclosure, for each cell 110, the edge area (e.g., the edge of the left long side) of the front side where the front-side connection line 130 is located and the opposite edge area (e.g., the edge of the right long side) of the back side are overlap areas. The overlap areas are limited to a relatively small range to ensure the cell efficiency, i.e., the widths of the overlap areas are relatively small. The front-side connection line 130 is located within the overlap area on the front side of the cell 110. The front-side connection line 130 is directly connected to the front-side fine grid lines 120. A distance between the front-side connection line 130 and the endpoints of the front-side fine grid lines 120 on the same side is a, and a is equal to or greater than zero and less than the width of the overlap area. In other words, the front-side connection line 130 can be designed at the endpoints of the front-side fine grid lines 120 on the same side or at a distance a from the endpoints of the front-side fine grid lines 120 on the same side, and the distance a is less than the width of the overlap area, for example, a is equal to or less than 2 mm. In this embodiment, the front-side connection line 130 is located at the left endpoints of all front-side fine grid lines 120, i.e., the front-side connection lime 130 connects the left endpoints of all front-side fine grid lines 120.

In this embodiment, the front-side connection line is located within the overlap area, so as to be in direct contact with the back-side fine grid lines of the other overlapping cell unit, realizing the current conduction. The front-side connection line is directly connected to the front-side fine grid lines, i.e., the front-side connection line and the front-side fine grid lines are crossed, and the distance a between the front-side connection line and the positions adjacent to the ends of the front-side fine grid lines is equal to or greater than zero and less than the width of the overlap area, ensuring that the front-side connection line is within the overlap area to realize the current conduction between the two cell units.

In this embodiment, the front-side connection line 130 is arranged on one edge of the front side of the cell 100 and on the same side of the front-side fine grid lines 120, and an auxiliary connection line 140 is arranged on the other edge of the front side. The auxiliary connection line 140 is connected to all front-side fine grid lines 120 respectively, i.e., the front-side connection line 130 is arranged on the left edge of the cell 110, and the auxiliary connection line 140 is arranged on the right edge of the cell 110. The auxiliary connection line 140 can be arranged in the same form as the front side connection line 130. In this embodiment, the auxiliary connection line 140 is connected to the right ends of all front-side fine grid lines 120. In order to reduce production cost, the width of the auxiliary connection line 140 is not greater than that of the front-side fine grid lines 120. In this embodiment, the width of the auxiliary connection line 140 is equal to the widths of the front-side fine grid lines 120. In this embodiments, short connections between the front-side fine grid lines can be realized by using the auxiliary connection line, and the current can be collected and output through other front-side fine grid lines when some front-side fine grid lines are not printed well.

Figure 9:
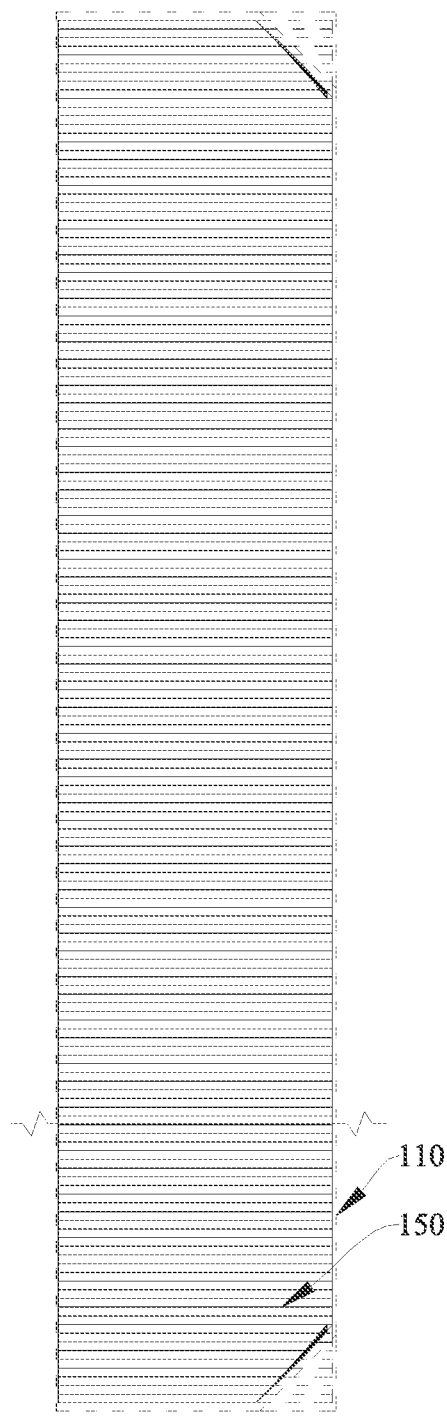
FIG. 9 is a schematic diagram of a structure of the back side of a cell unit according to an embodiment of the present disclosure.
Figure 10:
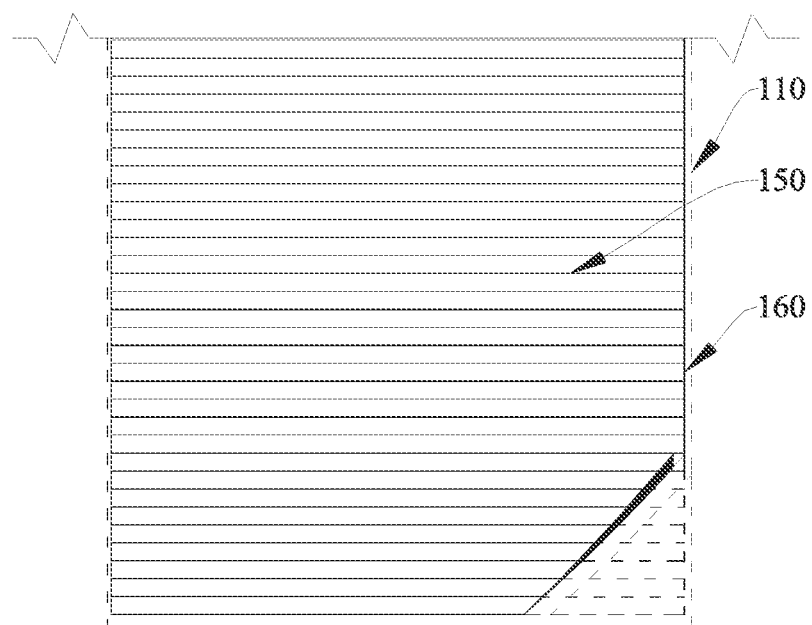
FIG. 10 is a schematic diagram enlarging a structure of the lower half of the cell unit shown in FIG. 9.

Referring to FIG. 9 and FIG. 10, the schematic diagram of the back side structure of the cell unit 100 shown in FIG. 9 is a view presented by rotating the front view of the cell unit 100 shown in FIG. 1 by 180° around the short side. The back side of the cell unit 100 in the embodiments of the present disclosure may also be designed in a back surface field manner. In this embodiment, the back side of the cell 110 includes a back-side connection line 160. The back-side connection line 160 is perpendicular to the back-side fine grid lines 150. The back-side connection line 160 is connected to the ends of all the back-side fine grid lines 150 on the same side. The back-side connection line 160 and the front-side connection line 130 are located on edges of opposite sides of the cell 110, respectively. The back-side connection line 160 is such configured that when two cell strips 100 are overlapped along the extension direction of the front-side fine grid lines 120, the back-side connection line 160 of the upper cell unit 100 contacts each front-side fine grid line 120 of the lower cell unit 100. In this embodiment, when the two cell units are overlapped along the direction of the front-side fine grid lines, the front-side connection line and each front-side fine grid line of the lower cell unit are in contact with each back-side fine grid line and the back-side connection line of the upper cell unit. Such a double contact ensures effective contact between the front-side fine grid lines of the lower cell unit and the back-side fine grid lines of the upper cell unit, ensuring that the current conducted to the edge by all the fine grid lines of one cell unit can be effectively conducted to the next cell unit. The back-side connection line 160 may be arranged in the same way as the front-side connection line 130 and will not be described here. The back-side connection line 160 is located within the overlap area of the back side. The back-side connection line 160 can be designed at the endpoints of the back-side fine grid lines 150 on the same side or at a distance b from the endpoints of the back-side fine grid lines 150 at the same side, and b is equal to or greater than zero and less than the width of the overlap area, for example, b is equal to or less than 2 mm. In this embodiment, the back-side connection line 160 is a continuous long line perpendicular to the back-side fine grid lines 150 and the front-side fine grid lines 120, and is arranged at the right endpoints of the back-side fine grid lines 150. In the case that the back side is in the back surface field manner, the back-side connection line 160 may also be set in the same way as described above, and the front-side fine grid lines 120 of each cell unit 100 are also designed to be perpendicular to the back-side connection line 160.

It should be noted that, in the embodiments of the present disclosure, the front-side connection line 130 may be arranged at one or both edges of the front side of the cell 110, and the back-side connection line 160 may be arranged at one or both edges of the back side of the cell 110. In this embodiment, the front-side connection line 130 is located at the left edge of the front side, and the back-side connection line 160 is located at the right edge of the back side. In the case that two cell units 100 are overlapped, the front-side connection line 130 and the back-side connection line 160 are located within the overlap area and are staggered, i.e., the front-side connection line 130 and the back-side connection line 160 do not overlap to ensure the contact effect.

In the embodiments of the present disclosure, the front-side connection line 130 and the back-side connection line 160 can be provided with the same or different line types and arrangements. The front-side and back-side patterns of the cell unit 100 can be designed differently, and can also be designed in a combined manner. Some specific arrangements will be listed in the following embodiments.

This embodiment also provides a shingled cell (not shown in the figures) that can be cut into a plurality of cell units 100 as described above.

Accordingly, this embodiment also provides a shingled photovoltaic assembly (not shown in the figures), which includes a plurality of cell strings. Each cell string is formed by connecting multiple aforementioned cell units 100 in series, with the cell units 100 overlapping sequentially along the extension direction of the front-side fine grid lines 120. The two ends of each cell string are each provided with a confluence line. When the cell units 100 are overlapped in the form of shingles, the overlap areas of adjacent cell units 100 are stacked and bonded using conductive or non-conductive adhesive. When the conductive adhesive is used for bonding, the conductive adhesive only needs to be disposed within the overlap area. However, when the non-conductive adhesive is used for bonding, the non-conductive adhesive needs to avoid the front-side connection line 130 and the back-side connection line 160, for example, by setting intervals to ensure the front-side connection line 130 and the back-side connection line 160 make contact with the front-side fine grid lines 120 and the back-side fine grid lines 150 for the inter-cell current conduction between adjacent cell units 100.

For each cell unit 100 of the shingled photovoltaic assembly, the ends/endpoints of the front-side fine grid lines 120 and the back-side fine grid lines 150 are provided with sufficient conductive channels by arranging the front-side connection line 130 and the back-side connection line 160, so that the current conducted by each grid line on each cell unit 100 to the edges can be effectively transmitted to the next cell unit, and finally the power is output through the confluence lines arranged at the ends of the cell strings.

In this embodiment, the shingled photovoltaic assembly composed of the cell units can greatly reduce the electrode production cost, reduce the manufacturing cost, and improve the competitiveness of the shingled assembly.

Second Embodiment

Figure 3:
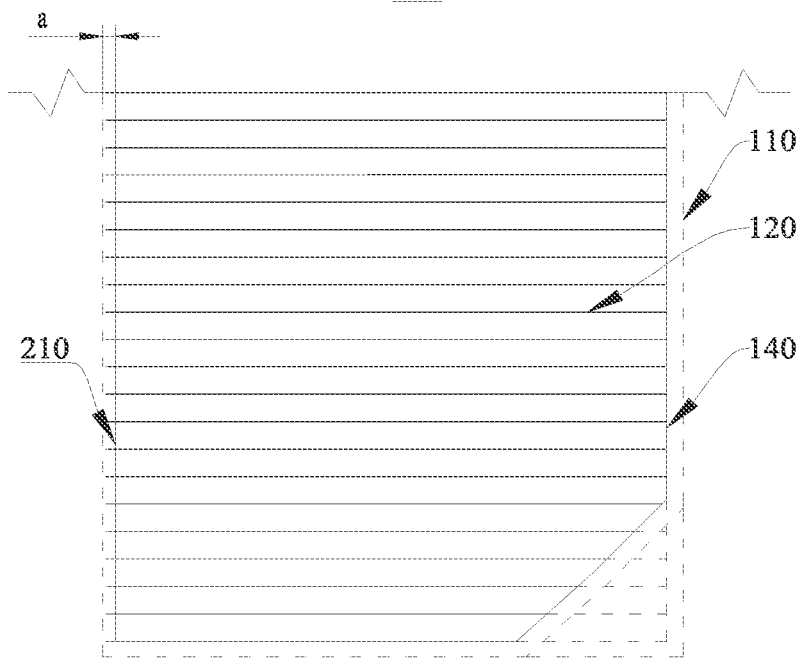
FIG. 3 is a schematic diagram enlarging a structure of the lower half of the front side of a cell unit according to a second embodiment of the present disclosure.

Referring to FIG. 3, FIG. 9 and FIG. 10, a cell unit 200 provided in this embodiment is substantially the same as the cell unit 100 in the first embodiment. The front-side connection line 210 is a continuous long line and perpendicular to the front-side fine grid lines 120. The difference is that the endpoints of the front-side fine grid lines 120 on the same side pass through the front-side connection line 210. The distance between the front-side connection line 210 and the endpoints of the front-side fine grid lines 120 on the same side is a, and a is equal to 1 mm for example, i.e., the front-side connection line 210 is indented compared to the front-side fine grid lines 120.

Third Embodiment

Figure 4:
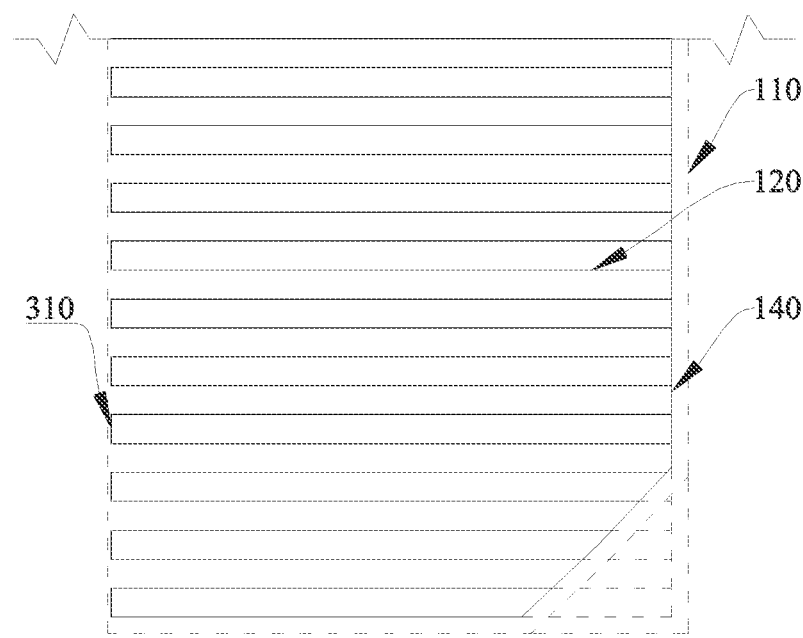
FIG. 4 is a schematic diagram of a structure of the lower half of the front side of a cell unit according to a third embodiment of the present disclosure.

Referring to FIG. 4, FIG. 9 and FIG. 10, a cell unit 300 provided in this embodiment is substantially the same as the cell unit 100 in the first embodiment. The difference is that the front-side connection line 310 is composed of a plurality of short lines arranged at intervals. All the short lines are arranged in a straight line (i.e., located at the same straight line). Each short line is connected to the endpoints of two adjacent front-side fine grid lines 120 on the same side, i.e., the front-side connection line 310 is a non-continuous line.

Fourth Embodiment

Figure 5:
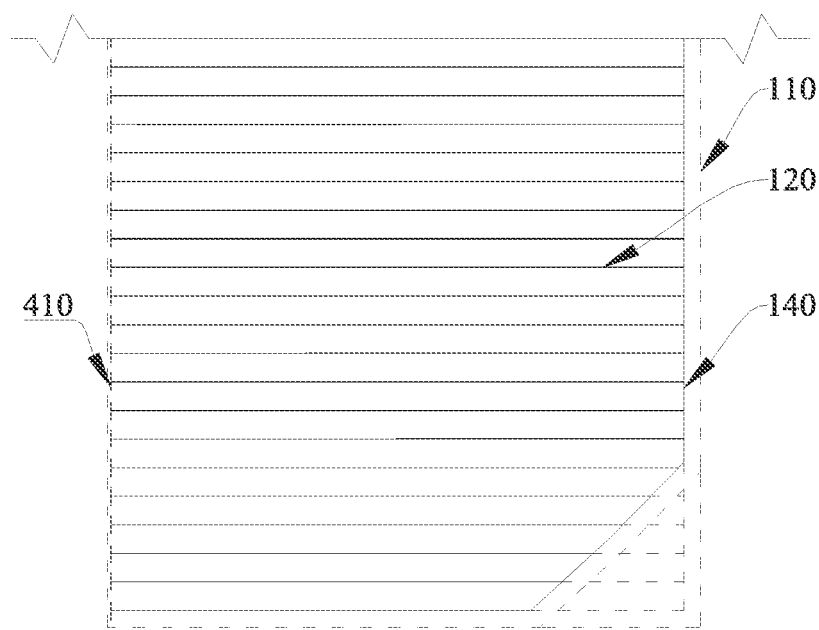
FIG. 5 is a schematic diagram of a structure of the lower half of the front side of a cell unit according to a fourth embodiment of the present disclosure.

Referring to FIG. 5, FIG. 9 and FIG. 10, a cell unit 400 provided in this embodiment is substantially the same as the cell unit 100 in the first embodiment. The difference is that the front-side connection line 410 is composed of a plurality of short lines arranged at intervals. All the short lines are arranged in a straight line. Each short line is connected to an end of one corresponding front-side fine grid line 120, i.e., the front-side connection line 410 is a non-continuous line.

Fifth Embodiment

Figure 6:
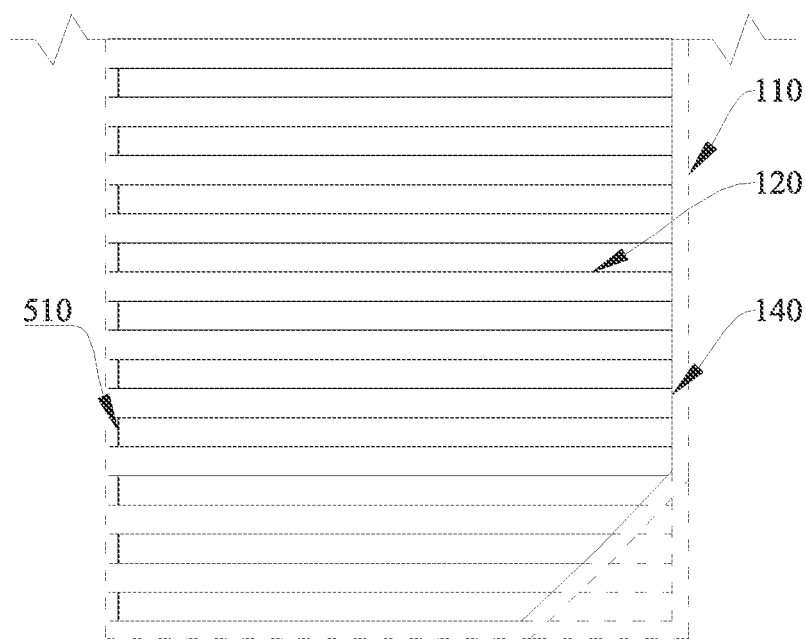
FIG. 6 is a schematic diagram of a structure of the lower half of the front side of a cell unit according to a fifth embodiment of the present disclosure.

Referring to FIG. 6, FIG. 9, and FIG. 10, this embodiment provides a cell unit 500, which differs from the cell unit 100 in the first embodiment in that the front-side connection line 510 is composed of a plurality of short lines arranged at intervals. The short lines are arranged in a straight line. Each short line is connected to the ends of two adjacent front-side fine grid lines 120 on the same side, and the distance between the front-side connection line 510 and the endpoints of the front-side fine grid lines 120 on the same side is greater than zero, for example 1 mm, i.e., the front-side connection line 510 is a non-continuous line and is indented compared to the front-side fine grid lines 120.

Sixth Embodiment

Figure 7:
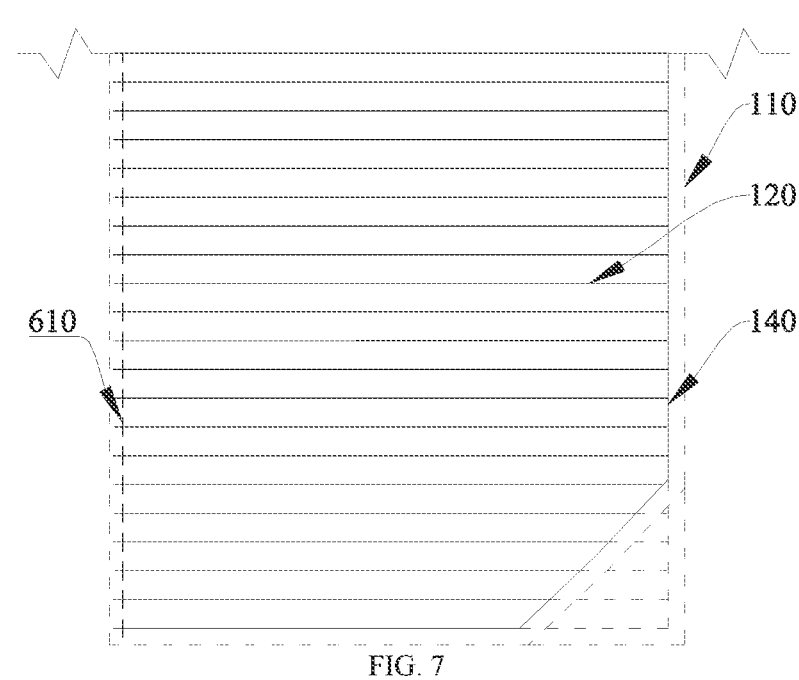
FIG. 7 is a schematic diagram of a structure of the lower half of the front side of a cell unit according to a sixth embodiment of the present disclosure.

Referring to FIG. 7, FIG. 9 and FIG. 10, a cell unit 600 provided in this embodiment is substantially the same as the cell unit 100 in the first embodiment. The difference is that the front-side connection line 610 is composed of a plurality of short lines arranged at intervals. All the short lines are arranged in a straight line. Each short line is connected to an end of one corresponding front-side fine grid line 120, and the distance between the front-side connection line 610 and the endpoints of the front-side fine grid lines on the same side is greater than zero, for example 1 mm, i.e., the front-side connection line 610 is a non-continuous line and is indented compared to the front-side fine grid lines 120.

Seventh Embodiment

Figure 8:
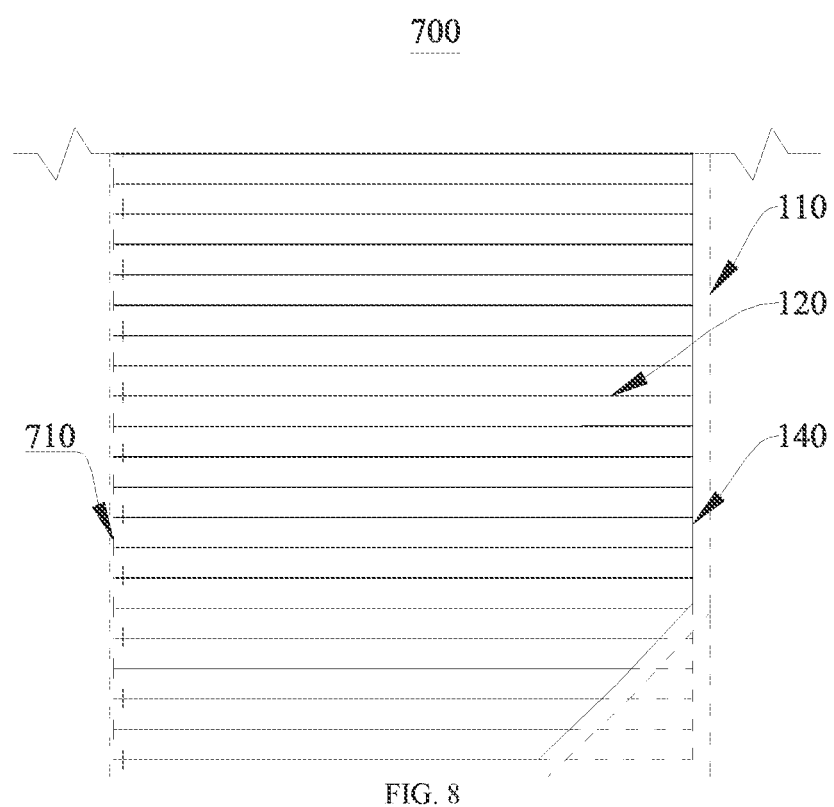
FIG. 8 is a schematic diagram of a structure of the lower half of the front side of a cell unit according to a seventh embodiment of the present disclosure.

Referring to FIGS. 8 to 10, a cell unit 700 provided in this embodiment is substantially the same as the cell unit 100 in the first embodiment. The difference is that the front-side connection line 710 is composed of a plurality of short lines arranged at intervals. The short lines are grouped into two groups (also referred to as a first group and a second group). Each group of short lines are arranged in a straight line. The two groups of short lines are staggered. Each short line of the first group is connected to the endpoint of one corresponding front-side fine grid line 120. The short lines of the second group are connected to the corresponding ends of the remaining front-side fine grid lines 120 on the same side, respectively, and the distance between the short lines of the second group and the endpoints of the front-side fine grid lines 120 on the same side is greater than zero, for example 1 mm, i.e., the front-side connection line 710 is a non-continuous line with some portions indent compared to the front-side fine grid lines 120.

In summary, the shingled cell, cell unit, and shingled photovoltaic assembly provided in the embodiments of the present disclosure are designed without busbars, greatly reducing electrode production cost.

The above are only embodiments of the present disclosure and are not intended to limit the scope of protection of the present disclosure. For those skilled in the art, the present disclosure may have various changes and variations. Any modification, equivalent replacement, improvement, etc. made within the spirit and principles of the present disclosure shall be included in the scope of protection of the present disclosure.

INDUSTRIAL APPLICABILITY

The present disclosure provides a shingled cell, a cell unit, and a shingled photovoltaic assembly, which relate to the field of solar cell manufacturing. The cell unit includes a cell. The front side of the cell includes a plurality of parallel front-side fine grid lines. The back side of the cell includes a plurality of parallel back-side fine grid lines, alternatively, the back side includes a back electrode and a back surface field. The front side of the cell also includes a front-side connection line. The front-side connection line is a continuous or non-continuous line segment. The front-side connection line is arranged on at least one side of the cell. The front-side connection line is connected to the ends of all the front-side fine grid lines on the same side. The front-side connection line is such configured that when two cell units are overlapped along the extension direction of the front-side fine grid lines, the front-side connection line of the lower cell unit contacts each of the back-side fine grid lines of the upper cell unit. The shingled cell, the cell unit, and the shingled photovoltaic assembly are designed without busbars, greatly reducing electrode production cost.

In addition, it should be understood that the shingled cell, the cell unit, and the shingled photovoltaic assembly of the present disclosure are reproducible and can be applied to various industrial applications. For example, the shingled cell, the cell unit, and shingled photovoltaic assembly of the present disclosure can be applied to the field of solar cell manufacturing.

What is claimed is:

1. A cell unit, comprising a cell,
a front side of the cell comprising a plurality of parallel front-side fine grid lines,
a back side of the cell comprising a plurality of parallel back-side fine grid lines,
the front side of the cell further comprising one front-side connection line,
wherein the front-side connection line is a continuous or non-continuous line arranged on at least one side of the cell, the front-side connection line is connected to ends of all the parallel front-side fine grid lines on a same side respectively, the front-side connection line is such configured that when two cell units are overlapped along an extension direction of the front-side fine grid lines, the front-side connection line of a lower cell unit directly contacts each of the parallel back-side fine grid lines of an upper cell unit.

2. The cell unit according to claim 1, wherein, for each cell, an edge area of the front side where the front-side connection line is located and an opposite edge area of the back side are overlap areas, the front-side connection line being located within the overlap area on the front side of the cell and directly connected to the front-side fine grid lines; a distance between the front-side connection line and endpoints of the front-side fine grid lines on a same side is equal to or greater than zero and less than a width of the overlap area.

3. The cell unit according to claim 1, wherein the front-side fine grid lines and the back-side fine grid lines of each cell unit are parallel to each other; and/or
the front-side connection line is perpendicular to the front-side fine grid lines;
or
the back side of the cell comprise a back electrode and a back surface field instead of the back-side fine grid lines, the front-side fine grid lines and the back electrode of each cell unit being perpendicular to each other.

4. The cell unit according to claim 1, wherein the front-side connection line is a continuous long line, and the long line is connected to the ends of all the front-side fine grid lines on the same side, respectively.

5. The cell unit according to claim 1, wherein the front-side connection line is composed of a plurality of short lines arranged at intervals, and each short line is connected to the end of at least one front-side fine grid line on the same side.

6. The cell unit according to claim 1, wherein the back side of the cell further comprises a back-side connection line being connected to ends of all the back-side fine grid lines on a same side respectively, the back-side connection lines and the front-side connection lines are respectively located on edges of opposite sides of the cell, and the back-side connection line is such configured that when two cell units are overlapped along the extension direction of the front-side fine grid lines, the back-side connection line of the upper cell unit contacts each front-side fine grid line of the lower cell unit.

7. The cell unit according to claim 1, the front-side connection line is arranged on one edge of the front side of the cell and on the same side of the front-side fine grid lines, an auxiliary connection line is arranged on the other edge of the front side, a width of the auxiliary connection line is not greater than that of the front-side fine grid lines, and the auxiliary connection line is connected to all the front-side fine grid lines respectively.

8. The cell unit according to claim 1, the front-side fine grid lines and the back-side fine grid lines are printed using silver paste.

9. The cell unit according to claim 1, wherein widths of the front-side fine grid lines and the back-side fine grid lines are the same and greater than that of the front-side connection line.

10. The cell unit according to claim 1, wherein a layout density of the front-side fine grid lines is smaller than that of the back-side fine grid lines.

11. The cell unit according to claim 5, all the short lines being arranged in a straight line, wherein:
each short line is connected to endpoints of two adjacent front-side fine grid lines on the same side; or
each short line is connected to an end of one corresponding front-side fine grid line; or each short line is connected to ends of two adjacent front-side fine grid lines on the same side, and a distance between the front-side connection line and the endpoints of the front-side fine grid lines on the same side is greater than zero; or each short line is connected to an end of one corresponding front-side fine grid line, and a distance between the front-side connection line and endpoints of the front fine grid lines on the same side is greater than zero.

12. The cell unit according to claim 5, wherein the short lines are grouped into a first group and a second group, each group of short lines being arranged in a straight line, and the two groups of short lines being staggered;

each short line of the first group is connected to an endpoint of one corresponding front-side fine grid line; and the short lines of the second group are respectively connected to corresponding ends of remaining front-side fine grid lines on a same side, and a distance between the short lines of the second group and the endpoints of the front-side fine grid lines on the same side is greater than zero, such that some portions of the front-side connection line indent compared to the front-side fine grid lines.

\* \* \* \* \*